(12) United States Patent
Ni et al.

(10) Patent No.: US 7,507,119 B2
(45) Date of Patent: Mar. 24, 2009

(54) USB DEVICE WITH INTEGRATED USB PLUG WITH USB-SUBSTRATE SUPPORTER INSIDE

(75) Inventors: Jim Chin-Nan Ni, San Jose, CA (US); Charles C. Lee, Cupertino, CA (US); Abraham C. Ma, Fremont, CA (US); Ming-Shiang Shen, Taipei Hsien (TW)

(73) Assignee: Super Talent Electronics, Inc., San Jose, CA (US)

( * ) Notice: Subject to any disclaimer, the term of this patent is extended or adjusted under 35 U.S.C. 154(b) by 309 days.

(21) Appl. No.: 11/309,847

(22) Filed: Oct. 12, 2006

(65) Prior Publication Data

US 2007/0184719 A1  Aug. 9, 2007

Related U.S. Application Data

(63) Continuation-in-part of application No. 10/707,277, filed on Dec. 2, 2003, now Pat. No. 7,103,684, and a continuation-in-part of application No. 09/478,720, filed on Jan. 6, 2000, now Pat. No. 7,257,714.

(51) Int. Cl.
*H01R 13/648* (2006.01)

(52) U.S. Cl. .................................................. 439/607

(58) Field of Classification Search ......... 439/607–610, 439/660, 76.1, 718, 689, 79, 541.5, 379, 439/295, 377; 235/431, 451, 441; 361/737, 361/752, 785, 756, 791, 803, 802, 727, 746
See application file for complete search history.

(56) References Cited

U.S. PATENT DOCUMENTS

| 5,899,773 | A | 5/1999 | Cheng | 439/651 |
|---|---|---|---|---|
| 6,554,648 | B2 | 4/2003 | Shi et al. | 439/607 |
| 6,567,273 | B1 | 5/2003 | Liu et al. | 361/737 |
| 6,854,984 | B1 | 2/2005 | Lee et al. | 439/79 |
| 7,021,971 | B2 | 4/2006 | Chou et al. | 439/660 |
| 7,074,052 | B1 | 7/2006 | Ni et al. | 439/76.1 |
| 7,090,541 | B1 | 8/2006 | Ho | 439/660 |
| 7,094,074 | B2 * | 8/2006 | Chiou et al. | 439/79 |
| 7,252,518 | B1 * | 8/2007 | Ni | 439/76.1 |
| 7,297,024 | B2 * | 11/2007 | Ni et al. | 439/607 |
| 2003/0100203 | A1 | 5/2003 | Yen | 439/79 |
| 2005/0085133 | A1 | 4/2005 | Wang et al. | 439/660 |
| 2006/0184709 | A1 | 8/2006 | Hiroshi et al. | 710/313 |
| 2007/0076382 | A1 * | 4/2007 | Ni | 361/752 |

* cited by examiner

*Primary Examiner*—Edwin A. León
(74) *Attorney, Agent, or Firm*—gPatent LLC; Stuart T. Auvinen

(57) ABSTRACT

A Universal-Serial-Bus (USB) device has a USB plug with reduced wobble. A USB metal wrap around the perimeter of the USB plug is attached to a housing by overmolding. A plug supporter is inserted into the front of the USB metal wrap, and has locking tabs that snap over the inside wall of the housing. Side tabs on the plug supporter fit into side slots on the USB metal wrap to secure the plug supporter inside the USB metal wrap. A circuit board with a USB flash controller has USB metal contacts on an extension end that is inserted through the housing and into the USB metal wrap. The extension end fits underneath top tabs on the plug supporter, preventing the extension end with the USB metal contacts from upward wobble when the USB plug is inserted into a USB socket.

21 Claims, 15 Drawing Sheets

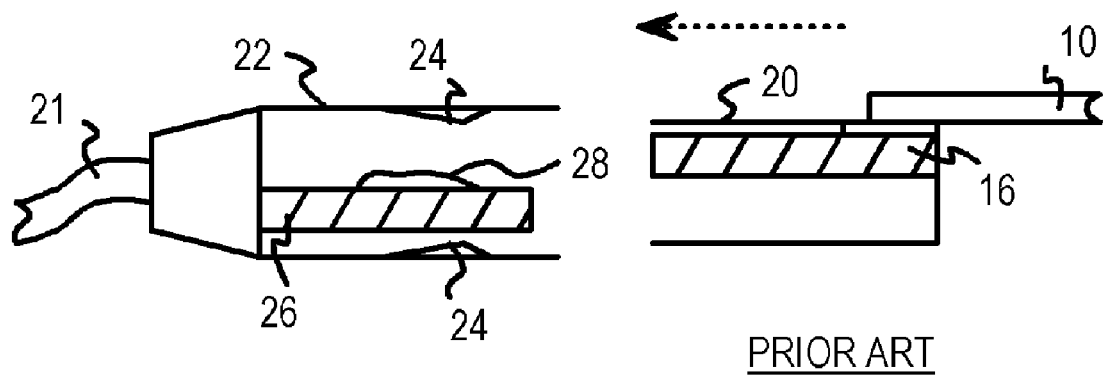
FIG. 2A PRIOR ART
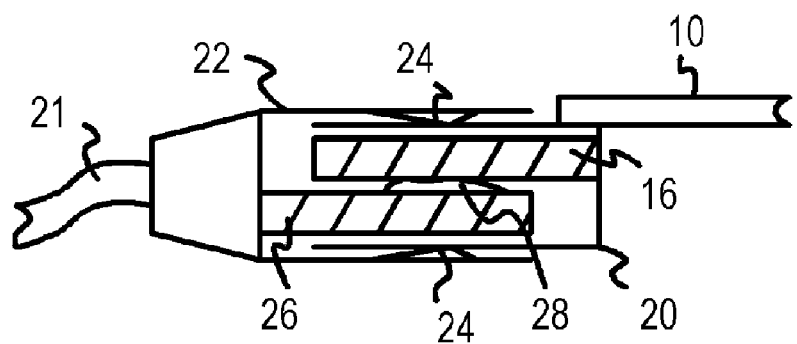
PRIOR ART FIG. 2B

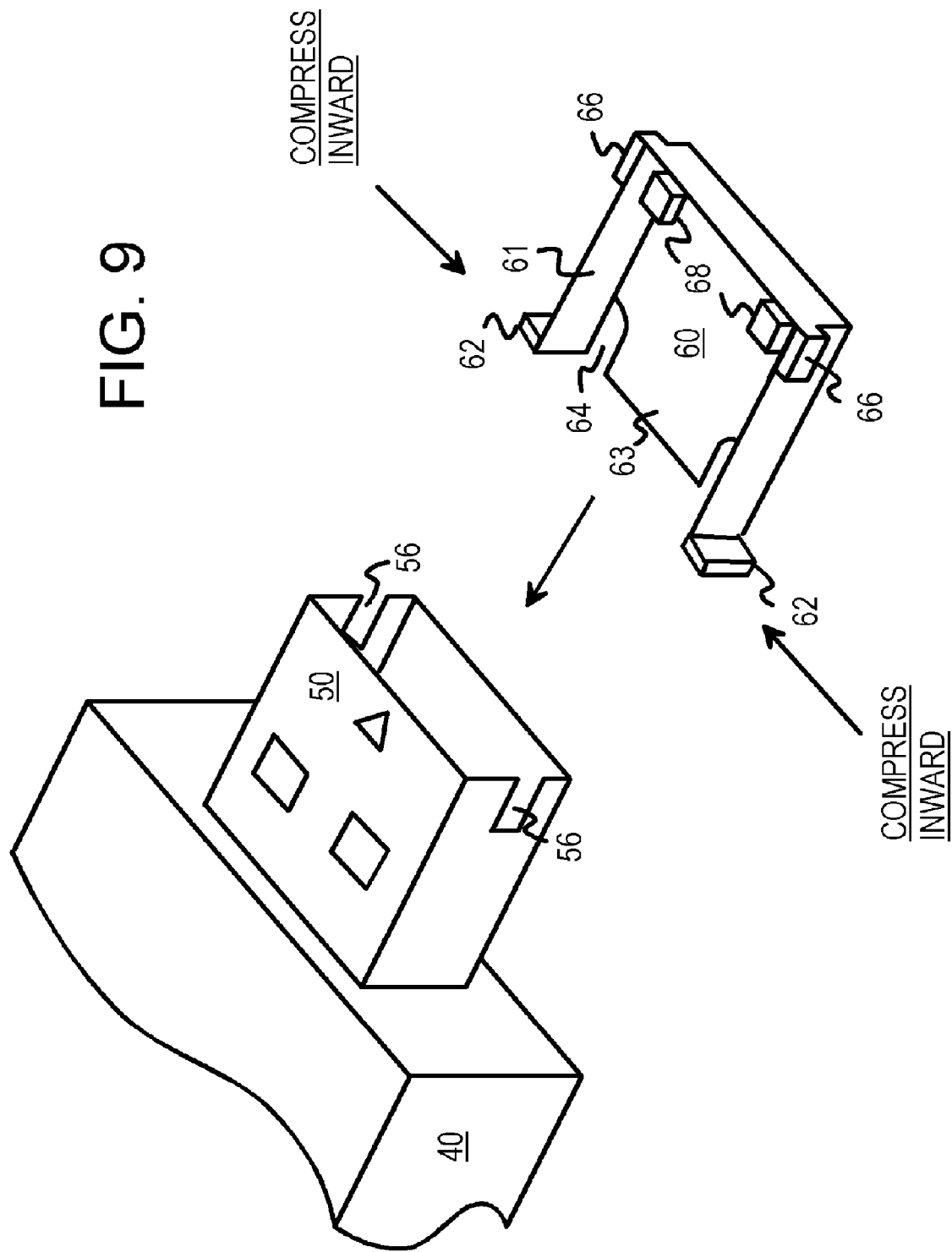

USB DEVICE WITH INTEGRATED USB PLUG WITH USB-SUBSTRATE SUPPORTER INSIDE

RELATED APPLICATIONS

This application is a continuation-in-part (CIP) of the co-pending application for "Electronic Data Storage Medium with Fingerprint Verification Capability", U.S. Ser. No. 09/478,720, filed Jan. 6, 2000.

This application is also a continuation-in-part (CIP) of the co-pending application for "Single-Chip USB Controller Reading Power-On Boot Code from Integrated Flash Memory for User Storage", U.S. Ser. No. 10/707,277, filed Dec. 2, 2003.

This application is further related to U.S. Pat. No. 6,854,984, filed Sep. 11, 2003, for "Slim USB connector with spring-engaging depressions, stabilizing dividers and wider end rails for flash-memory drive", and U.S. Pat. No. 7,052,287, filed May 16, 2005, for "USB device with plastic housing having integrated plug shell".

FIELD OF THE INVENTION

This invention relates to flash-memory-drive devices, and more particularly to devices with integrated Universal-Serial-Bus (USB) connectors.

BACKGROUND OF THE INVENTION

Flash memories have gained wide acceptance for non-volatile storage, which is ideal for portable devices that may lose power, since the data is not lost when stored in the flash memory. Flash memories are constructed from electrically-erasable programmable read-only memory (EEPROM) cells. Flash EEPROM chips may store 1 G-Bytes or more of data. Small flash-memory cards have been designed that have a connector that can plug into a specialized reader, such as for compact-flash, secure-digital, memory stick, or other standardized formats.

More recently, flash memory cards are being sold that contain a USB connector. Such USB-flash memory cards do not require a specialized reader but can be plugged into a USB connector on a personal computer (PC) or other hosting device. These USB-flash memory cards can be used in place of floppy disks. A USB-flash card can have a capacity of more than ten floppy disks in an area not much larger than a large postage stamp.

Rather than use a randomly-addressable scheme such as is common with dynamic-random-access memory (DRAM), many flash memories use a block-based addressing where a command and an address are sent over the data bus and then a block of data is read or written. Since the data bus is also use to send commands and addresses, fewer pins are needed on the flash-memory chip, reducing cost. Thus flash memory is often used as a mass-storage device rather than a randomly-addressable device.

FIG. 1A shows a prior-art flash-memory card with a USB connector. Flash memory chip 12 may be a 128 Mega-byte non-volatile chip or may have some other capacity. Controller chip 14 contains a flash-memory controller that generates signals to access memory locations within flash memory chip 12. Controller chip 14 also contains a USB interface controller that serially transfers data to and from flash memory chip 12 over a USB connection.

USB connector 20 may be mounted on board 10, which is a small circuit board with chips 12, 14 mounted thereon. Multi-layer printed-circuit board (PCB) technology can be used for board 10. A plastic case (not shown) can surround board 10.

USB connector 20 contains a small connector substrate 16, which is often white ceramic, black rigid plastic, or another sturdy substrate. Connector substrate 16 has four or more metal contacts 18 formed thereon. Metal contacts 18 carry the USB signals generated or received by controller chip 14. USB signals include power, ground, and serial differential data D+, D−.

USB connector 20 contains a metal case that wraps around connector substrate 16. The metal case touches connector substrate 16 on three of the sides of connector substrate 16. The top side of connector substrate 16, holding metal contacts 18, has a large gap to the top of the metal case. On the top and bottom of this metal wrap are formed holes 15. USB connector 20 is a male connector, such as a type-A USB connector.

FIG. 1B shows a female USB connector. Female USB connector 22 can be an integral part of a PC, or can be connected by cable 21. Another connector substrate 26 contains four metal contacts 28 that make electrical contact with the four metal contacts 18 of the male USB connector 20 of FIG. 1A. Connector substrate 26 is wrapped by a metal case, but small gaps are between the metal case and connector substrate 26 on the lower three sides.

Locking is provided by metal springs 24 in the top and bottom of the metal case. When male USB connector 20 of FIG. 1A is flipped over and inserted into Female USB connector 22 of FIG. 1B, metal springs 24 lock into holes 15 of male USB connector 20.

FIGS. 2A, 2B are cross-sections highlighting connections between male and female USB connectors. Female USB connector 22 is on the left while male USB connector 20 is being inserted from the right. Male USB connector 20 is flipped over relative to the view of FIG. 1A. Metal contacts 18 are formed on the lower surface of connector substrate 16 on male USB connector 20, while metal contacts 28 are formed on the upper surface of connector substrate 26 on Female USB connector 22. Thus the metal contacts face one another to allow for electrical contact when male USB connector 20 is inserted into Female USB connector 22 as shown in FIG. 2B.

Metal springs 24 formed on the metal case surrounding connector substrate 26 on Female USB connector 22 fit into holes on the metal case of male USB connector 20. This helps to lock the connectors together.

FIG. 3 shows a prior-art USB flash memory card using a slim USB connector. Male USB connector 20 of FIGS. 1, 2 is relatively large. The metal case in particular is cumbersome and increases manufacturing cost. Costs may be reduced by integrating male USB connector 30 with board 32. Board 32 is a PCB that has flash memory chip 12 and controller chip 14 mounted thereon. Board 32 is extended to include male USB connector 30, which has metal contacts 38 formed on end 36 of board 32.

The width and thickness of board 32 at end 36 containing male USB connector 30 is designed to approximately match that of connector substrate 16 of FIG. 1A. Plastic case 34 can enclose board 32 but have an opening for metal contacts 38. Plastic case 34 can cover the bottom and sides of male USB connector 30 up to end 36 to emulate potions of the metal case of the male USB connector of FIG. 1A.

FIGS. 4A, 4B show cross-sections of the prior-art slim USB connector being inserted into a standard Female USB connector. Board 32 that has male USB connector 30 formed on end 36 is flipped over from the view shown in FIG. 3, and end 36 is inserted into female USB connector 22 from the right side.

Metal contacts 38 are located on the lower surface of male USB connector 30. Plastic case 34 has an opening on the lower surface of male USB connector 30 to expose the metal contacts so they can make electrical connection with metal contacts 28 on the upper surface of connector substrate 26 of Female USB connector 22 when inserted as shown in FIG. 4B.

Plastic case 34 helps to fill the gap between board 32 and the top edge of the metal case of Female USB connector 22. Plastic case 34 is also formed along the thin edges of board 32 and helps to fill in the gaps between connector substrate 26 and the sides of the metal case of Female USB connector 22 that are above and below the plane of FIG. 4B.

While slim USB connector 30 can be less expensive and smaller than the standard USB connector, it fits less securely into a standard Female USB connector. The lack of the metal case removes the mechanical support provided as the male metal case that fits in the gap below connector substrate 26 and the bottom side of the metal case for the female connector.

The result is a noticeable wobble in the up and down direction when a USB flash memory card containing male USB connector 30 is inserted into Female USB connector 22. Vertical movement of 3-4 millimeter at the end of a 4-centimeter flash card can occur with slight finger pressure. This vertical play gives the user the feeling that the flash memory card is cheap and unreliable, even when sufficient electrical contact is made.

Related Patent Uses Dividers and End Rails to Aid Support

A related patent, U.S. Ser. No. 10/605,146, now U.S. Pat. No. 6,854,984, disclosed using dividers between the metal USB pads and end rails to increase support for a slim USB connector. A flash-memory card using such as supporting slim USB connector was also disclosed in the parent patent.

While useful, various improvements in the flash-memory card with the slim USB connector have been developed by the inventors. Manufacturing methods and products made by these methods are also being disclosed in this application.

BRIEF DESCRIPTION OF THE DRAWINGS

FIGS. 2A, 2B are cross-sections highlighting connections between male and female USB connectors.

FIG. 9 is an enlargement of the plug supporter fitting into the USB metal wrap.

DETAILED DESCRIPTION

The present invention relates to an improvement in flash-memory devices. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 5:
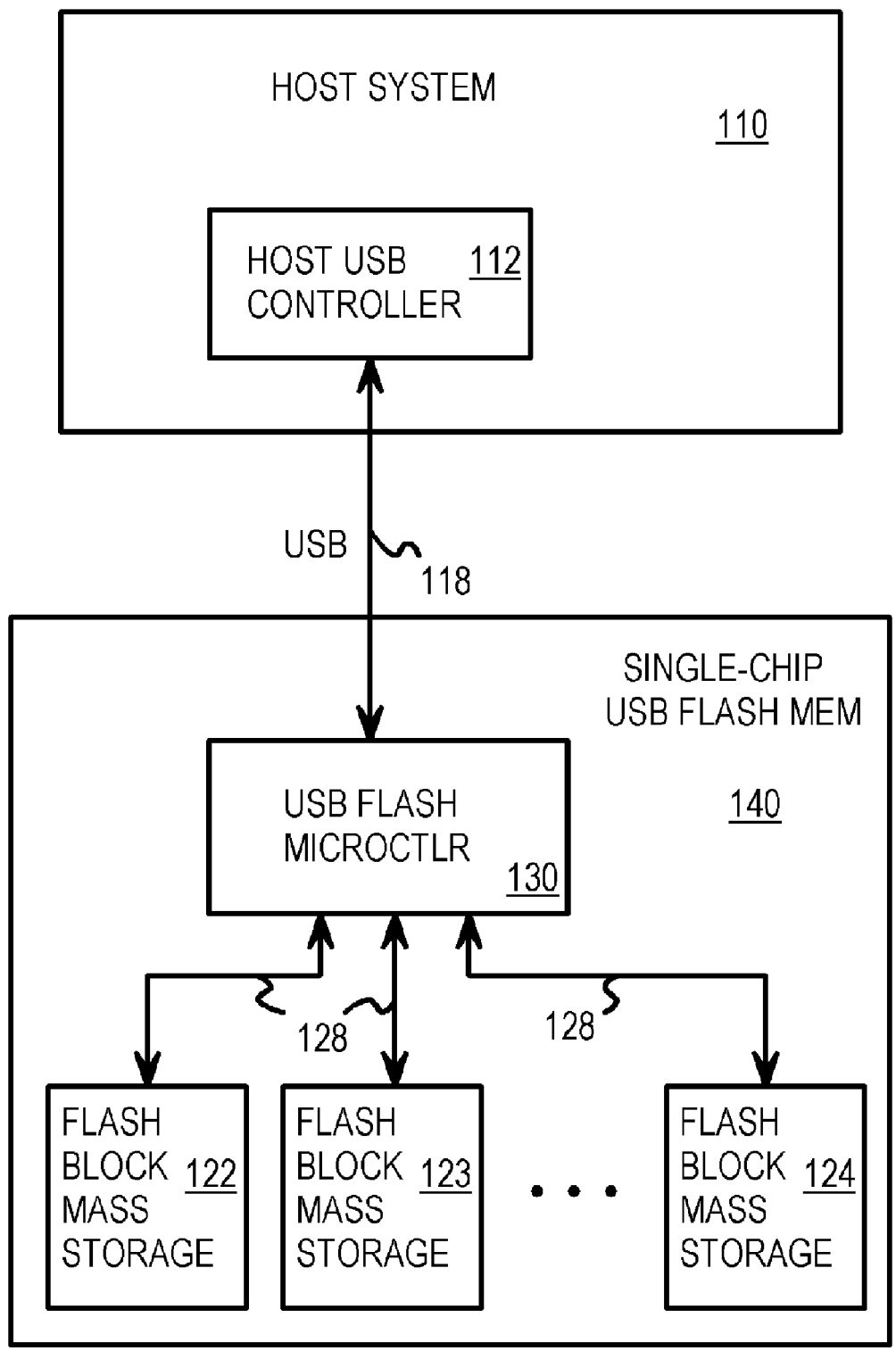
FIG. 5 is a block diagram of a flash microcontroller integrated with USB flash mass storage blocks.

FIG. 5 is a block diagram of a flash microcontroller integrated with USB flash mass storage blocks. USB host controller 112 for host 110 sends transactions over USB bus 118 to USB single-chip flash device 140. USB flash microcontroller 130 on USB single-chip flash device 140 receives and responds to transaction from host 110 over USB bus 118. USB flash microcontroller 130 has a serial interface that acts as the final USB endpoint for transactions on USB bus 118 from host 110.

USB flash microcontroller 130 also contains a flash-memory controller that sends data on internal flash buses 128 to flash mass storage blocks 122, 123, 124. Flash mass storage blocks 122, 123, 124 respond to internal requests from USB flash microcontroller 130 by transferring data over internal flash buses 128.

Since internal flash buses 128 are internal to USB single-chip flash device 140, external pins are not required for the interface to flash memory. A wider internal bus of 32, 64, or 128 bits can be used for internal flash buses 128, improving data bandwidth. However, flash mass storage blocks 122, 123, 124 are not randomly accessible. Instead, a command and an address are transferred as data over internal flash buses 128 to indicate a block of data to transfer from flash mass storage blocks 122, 123, 124. Thus flash mass storage blocks 122, 123, 124 are block-addressable mass storage rather than random-access memory (RAM).

Flash mass storage blocks 122, 123, 124 may be aggregated together by USB flash microcontroller 130, which maps and directs data transactions to selected flash storage blocks 122, 123, 124. Since USB flash microcontroller 130 performs memory management, flash storage blocks 122, 123, 124 appear as a single, contiguous memory to host 110.

Figure 6:
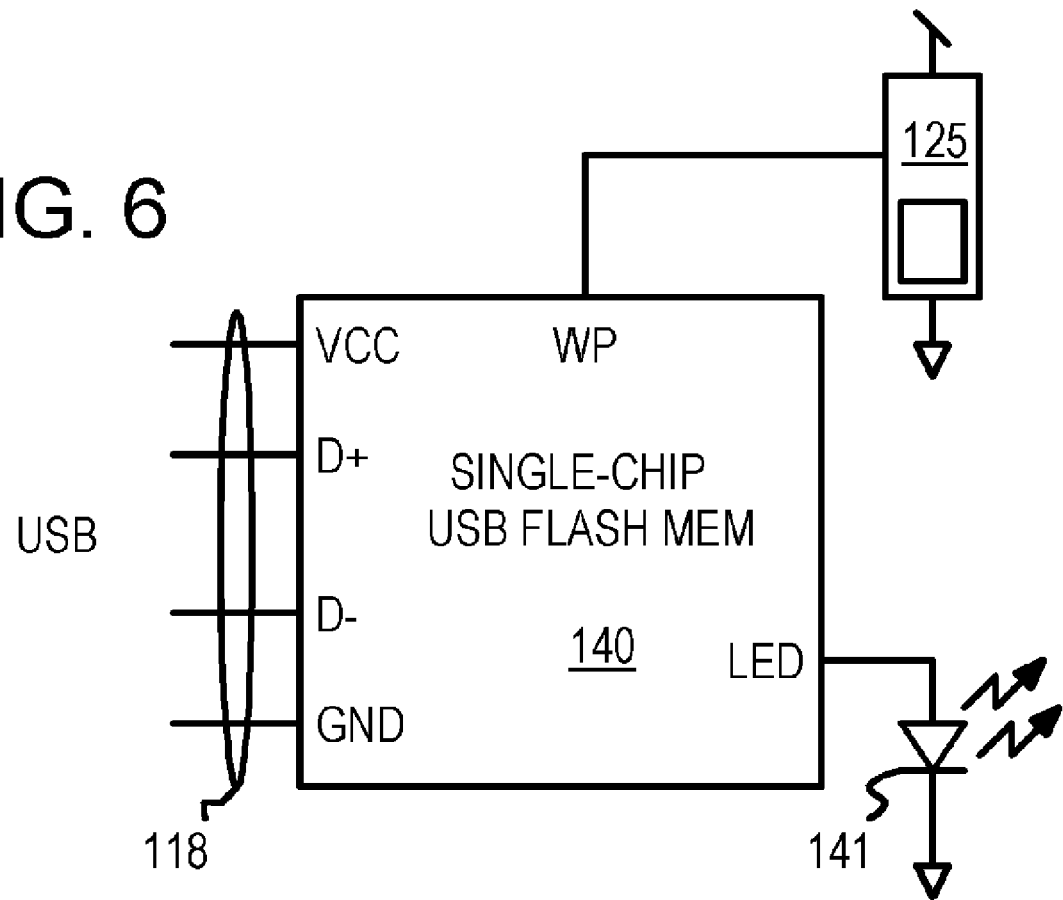
FIG. 6 shows external pin connections to a USB single-chip flash device.

FIG. 6 shows external pin connections to a USB single-chip flash device. USB single-chip flash device 140 connects to the host through USB bus 118, which has power (Vcc) and ground and differential data lines D+, D−. Data is sent over differential data lines as analog NRZI data.

A write-protect (WP) pin connects externally to switch 125. Switch 125 can be switched by the user to indicate write-protect or write-enable modes of the flash memory inside USB single-chip flash device 140.

A status output pin for a light-emitting diode (LED) can be included on some embodiments. The status-LED pin can drive LED 141 to indicate a status of USB single-chip flash device 140. For example, LED 141 can be made to blink when the internal flash memory is being written so that the user does not unplug the device before writing is completed.

Relatively few pins are needed for USB single-chip flash device 140. Since USB bus 118 is only 4 pins, including power and ground, as little as 5 pins are needed when no LED signaling is required. All commands, addresses, status, and data are carried as serial analog data over the differential data lines in USB bus 118. Additional power and ground pins, or pins for other functions could be added, but packages with fewer than 10 pins are relatively inexpensive and require little board space. Power consumption is also reduced, since fewer higher-capacitance external signals are driven by USB single-chip flash device 140.

Figure 7:
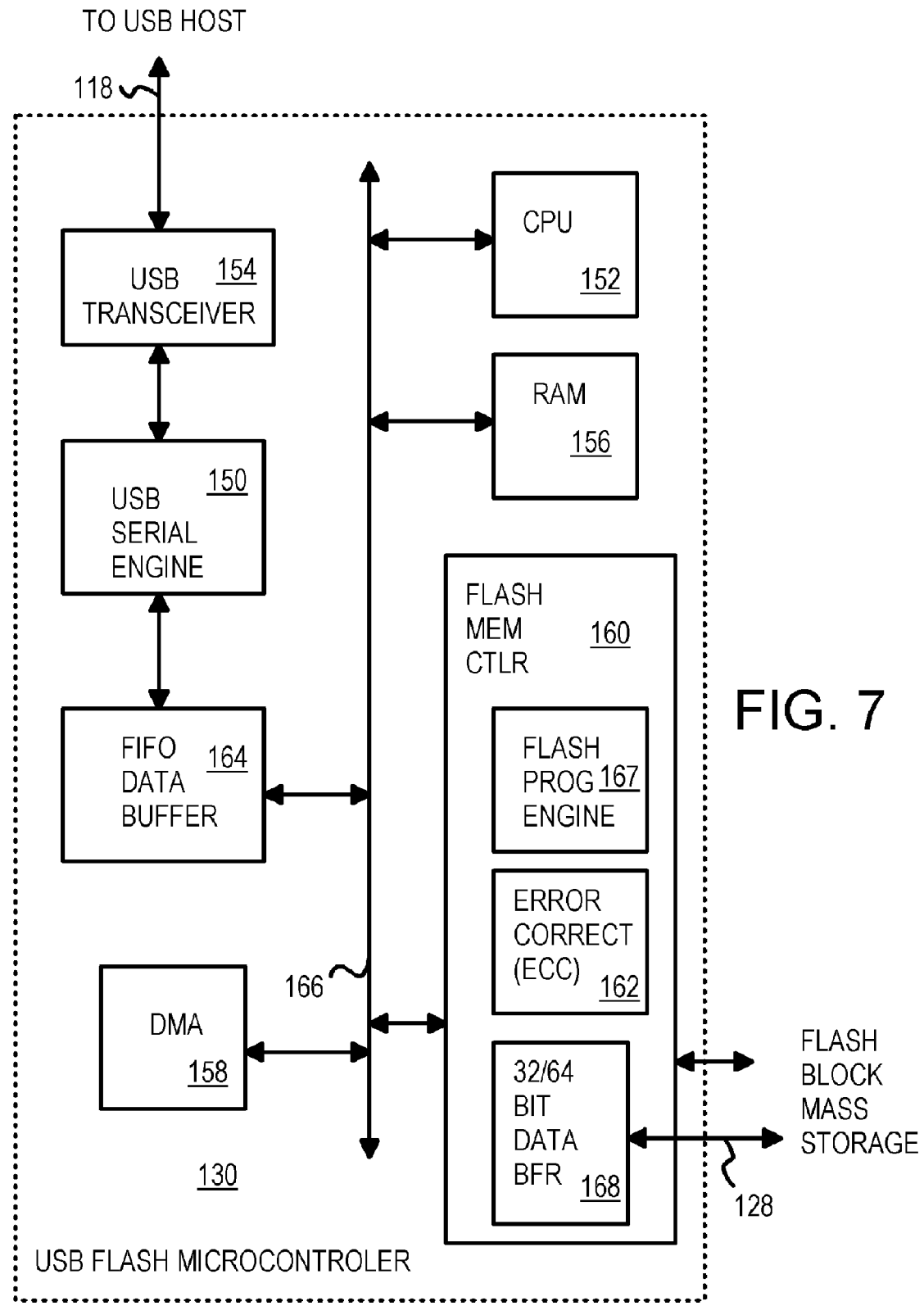
FIG. 7 is a block diagram of the USB flash microcontroller inside the USB single-chip flash device.

FIG. 7 is a block diagram of the USB flash microcontroller inside the USB single-chip flash device. Internal bus 166 connects CPU 152 with RAM 156, serial-data buffer 164, direct-memory access (DMA) engine 158, and flash-memory controller 160. CPU 152 executes instructions from RAM 156, while DMA engine 158 can be programmed to transfer data between serial-data buffer 164 and flash-memory controller 160. CPU 152 can operate on or modify the data by reading the data over bus 166. RAM 156 can store instructions for execution by the CPU and data operated on by the CPU.

Serial transceiver 154 connects to the differential data lines D+, D− of USB bus 118 and contains both a differential receiver and a differential transmitter. Data is encoded or decoded using NRZI encoding. Bit stuffing can be used to align data. An interrupt to CPU 152 can be generated when a start-of-packet sequence is detected on USB bus 118. CPU 152 can then execute a routine to handle the interrupt and process the new packet.

Serial engine 150 can perform higher-level functions such as checking cyclical-redundancy-check (CRC) checksums, locating packet identifiers, end-of-packet markers, higher-level frame markers, and converting serial data to parallel data words. The transmit and receive data is stored in serial-data buffer 164. Commands and addresses from the USB packets can also be stored in serial-data buffer 164, but is read by CPU 152 to determine what operation to perform rather than sent directly to flash-memory controller 160.

Flash-memory controller 160 includes flash data buffer 168, which contains the commands, addresses, and data sent over internal flash buses 128 to flash mass storage blocks 122, 123, 124. Data can be arranged in flash data buffer 168 to match the bus width of internal flash buses 128, such as in 132 or 64-bit words. DMA engine 158 can be programmed by CPU 152 to transfer a block of data between flash data buffer 168 and serial-data buffer 164.

Error-corrector 162 can read parity or error-correction code (ECC) from flash mass storage blocks 122, 123, 124 and perform data corrections. The parity or ECC bits for data in flash data buffer 168 that is being written to flash mass storage blocks 122, 123, 124 can be generated by error-corrector 162.

Flash programming engine 167 can be a state machine that is activated on power-up reset. Flash programming engine 167 programs DMA engine 158 with the address of the boot loader code in the first page of flash mass storage block 122 (FIG. 5), and the first address in RAM 156. Then flash programming engine 167 commands DMA engine 158 to transfer the boot loader from flash mass storage block 122 to RAM 156. CPU 152 is then brought out of reset, executing the boot loader program starting from the first address in RAM 156. The boot loader program can contain instructions to move a larger control program from flash mass storage block 122 to RAM 156. Thus USB flash microcontroller 130 is booted without an internal ROM on internal bus 166.

Figure 8:
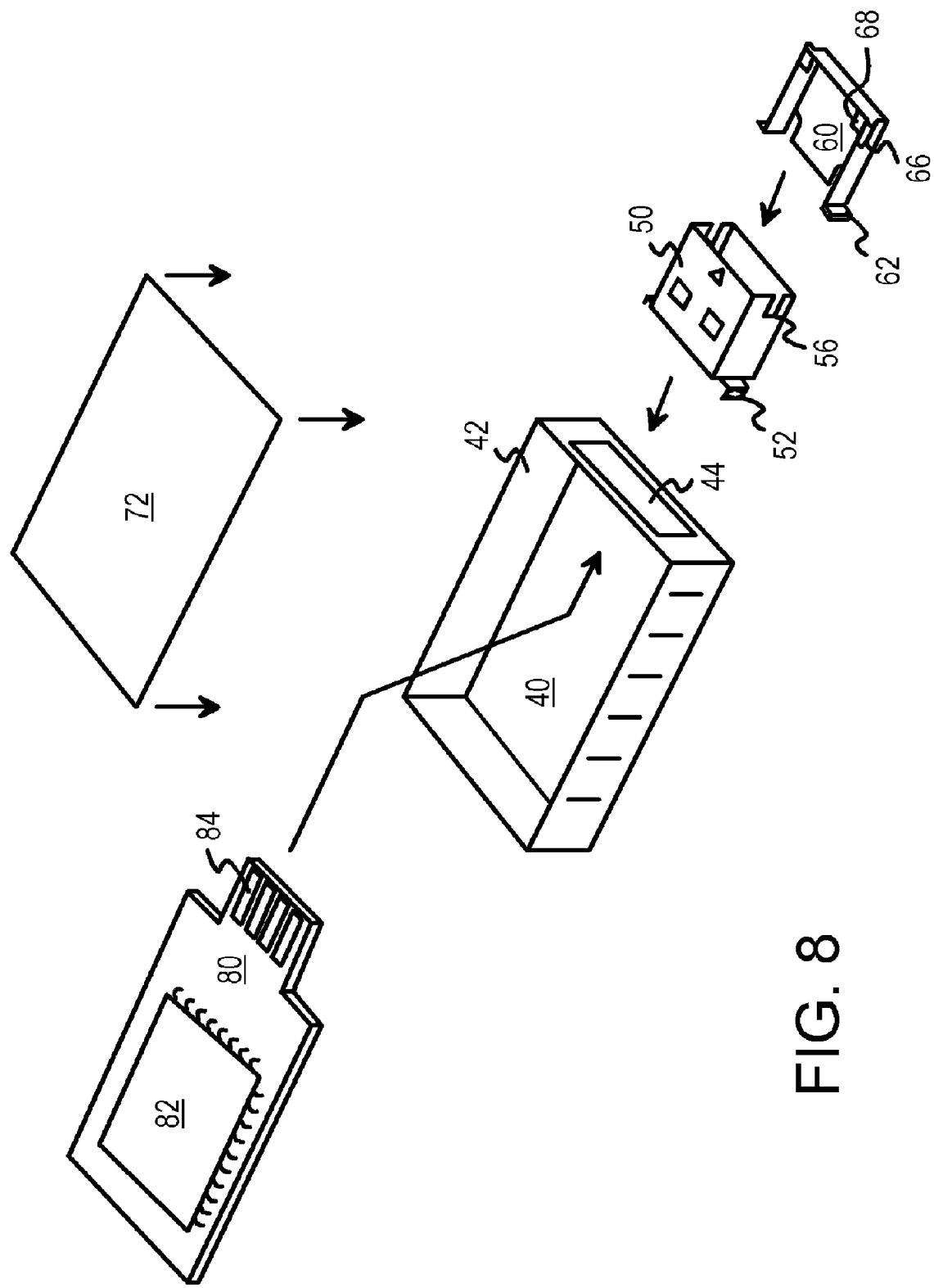
FIG. 8 shows parts, including a USB-plug supporter, that are assembled together to produce a flash-memory device.

USB-Plug Supporter—FIGS. 8-9

Figure 1A:
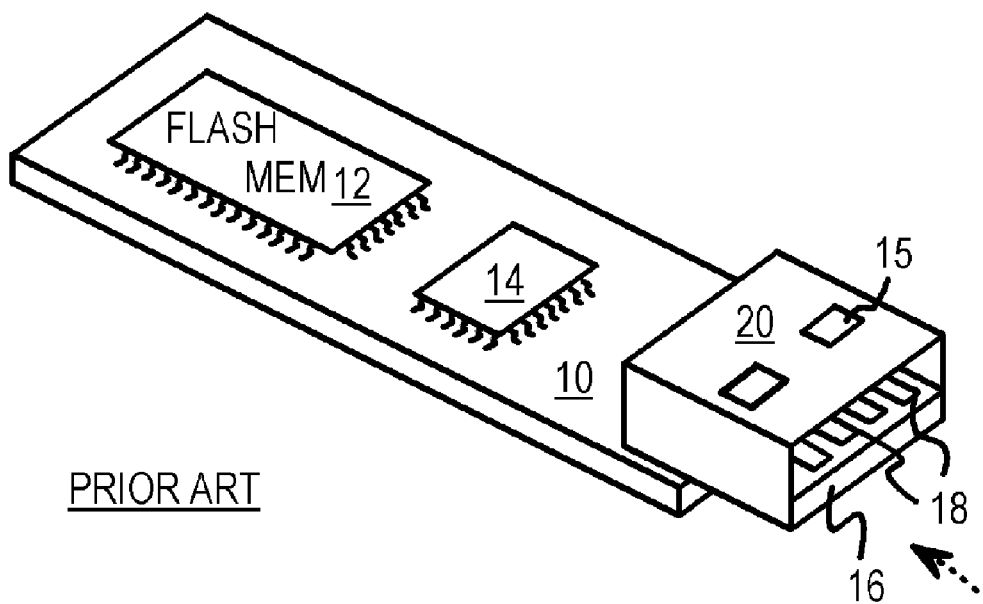
FIG. 1A shows a prior-art flash-memory card with a USB connector.
Figure 1B:
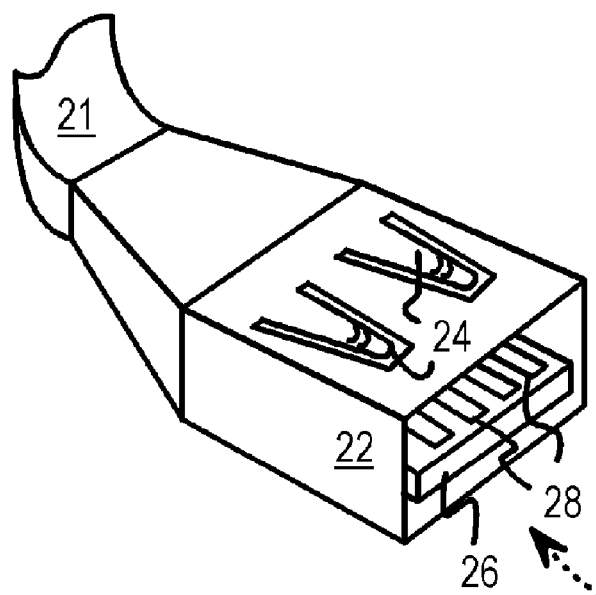
FIG. 1B shows a female USB connector.
Figure 3:
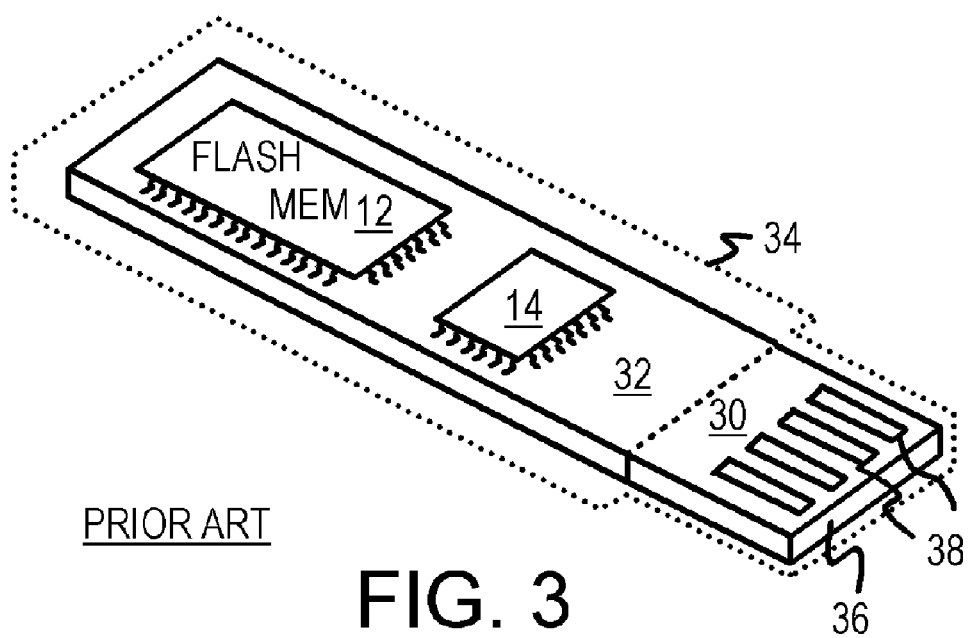
FIG. 3 shows a prior-art USB flash memory card using a slim USB connector.
Figure 4A:
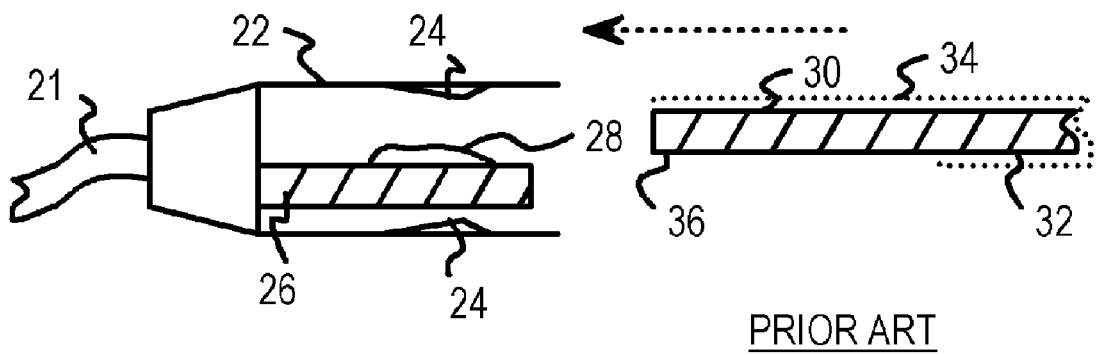
FIGS. 4A, 4B show cross-sections of the prior-art slim USB connector being inserted into a standard Female USB connector.
Figure 4B:
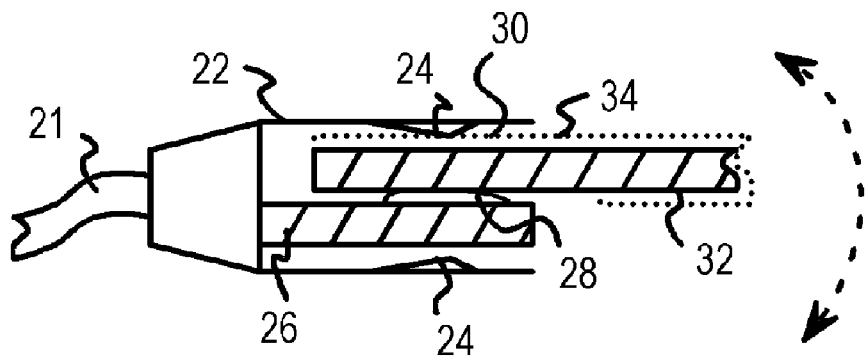

The inventors have realized that USB plugs for small, portable USB-flash devices often cause the USB device to wobble when plugged in, as shown in FIG. 4B. This wobble is undesirable, since the users view the loose connection as unreliable. This wobble can cause users to consider the USB device to be "cheap", even when expensive, high-quality integrated circuits are used within the USB device.

The inventors realize that this wobble is sometimes occurs when the USB plug substrate is formed as an extension of a circuit board that has the flash memory soldered to it. This circuit board may be thin to reduce costs, rather than thick and rigid. The flexibility of the circuit board can lead to a wobbly plug connection since the USB plug is partially formed from this flexible circuit board.

Having a metal wrap around the exterior of the USB plug reduces wobble somewhat, and improves rigidity. However, if the extension of the circuit board that contains the USB metal contacts within the metal wrap is too flexible, the plug may still wobble despite the surrounding metal wrap since the circuit board may flex inside the metal wrap.

The inventors have realized that thin circuit boards are desirable to reduce costs and overall device thickness. The inventors have developed an additional part that is inserted into the USB plug to increase support to the circuit board. This additional part, called a USB-plug supporter, is inserted into the outer metal USB wrap, and under the USB metal contacts on the extended part of the circuit board to provide support to the circuit board within the USB plug. The additional support provided by the USB plug supporter can stiffen the circuit board and reduce wobble. Users may perceive that the connection is more rigid, and view the USB device as being higher in quality.

FIG. 8 shows parts, including a USB-plug supporter, that are assembled together to produce a flash-memory device. USB metal wrap 50 is attached to housing 40 over opening 44 by an over-molding process that molds plastic over overmolding tabs 52 on the back of USB metal wrap 50.

Plug supporter 60 is inserted into the front of USB metal wrap 50 until locking tabs 62 fit through both USB metal wrap 50 and opening 44 of housing 40. Locking tabs 62 are securely clipped inside housing 40 when assembled. Plug supporter 60 is further secured inside USB metal wrap 50 by side tabs 66 that fit into side slots 56 that are cutout from the sides of USB metal wrap 50.

After plug supporter 60 has been inserted into the over-molded assembly of housing 40 and USB metal wrap 50, the printed-circuit board (PCB) assembly may be inserted. The PCB assembly includes flash chip 82, which may be a USB flash-memory controller such as USB flash microcontroller 130 of FIG. 7. Chip 82 may be packaged in a Ball-Grid-Array (BGA), Thin-Outline Small Package (TSOP), or other surface-mounted packages. Other chips may also be mounted to board 80, such as flash memory chips (not shown). Passive components such as capacitors and resistors may also be mounted to board 80. Board 80 can be a PCB with one or more layers of printed wiring traces.

USB metal contacts 84 are formed from the top-layer of metal on board 80, and have a size and spacing to function as USB contacts in a USB plug. The extension end of board 80 that contains USB metal contacts 84 is inserted through the large upper opening of housing 40, and through the smaller opening 44 and into USB metal wrap 50. The end of board 80 fits under top tabs 68 which add support to board 80 once assembled. Board 80 may also fit into groves or other holders (not shown) that are part of the interior of housing sidewalls 42 within housing 40. For example, board 80 may be clipped or snapped into such groves in housing 40 during assembly.

Once board 80 has been inserted into housing 40, USB metal contacts 84 on the extension end of board 80 are visible from the open end of USB metal wrap 50. The extension end of board 80 is held in place by plug supporter 60, reducing wobble of board 80 within USB metal wrap 50.

Cover 72 is snapped over the large upper opening of housing 40 after board 80 is inserted. Cover 72 can fit into groves around the inner perimeter of housing 40, or may have snaps that mate with other snaps or slots to secure cover 72. Cover 72 could also be attached by ultrasonic bonding, adhesive, or other methods.

Cover 72 may be transparent to allow light from a light-emitting diode (LED) or other source to shine through as an indicator light to a user. A label (not shown) may be placed over cover 72 with various markings. A cap (not shown) may be placed over USB metal wrap 50 for protection when the device is being transported, such as in a person's pocket or on a keychain.

FIG. 9 is an enlargement of the plug supporter fitting into the USB metal wrap. USB metal wrap 50 has been attached to housing 40 by an overmolding process. During assembly, plug supporter 60 is inserted into the front opening of USB metal wrap 50. Locking tabs 62 are pressed inward from both sides as shown, causing locking tabs 62 to be able to fit through the opening of USB metal wrap 50. Gaps 64 in bottom 63 of plug supporter 60 allow sidewalls 61 of plug supporter 60 to bend inward as locking tabs 62 are pressed.

Once plug supporter 60 is fully inserted into USB metal wrap 50, locking tabs 62 pass through opening 44 of housing 40 and are able to snap back outwardly as locking tabs 62 pass the interior surface of housing 40. Thus locking tabs 62 are secured into opening 44 of housing 40.

As plug supporter 60 is being inserted into the front opening of USB metal wrap 50, side tabs 66 are aligned to side slots 56 in the sides of USB metal wrap 50. Side tabs 66 slide into side slots 56 as insertion continues. Side tabs 66 fit into side slots 56 to prevent plug supporter 60 from moving up or down within USB metal wrap 50 once fully inserted. Thus side tabs 66 and side slots 56 prevent vertical play or wobble of plug supporter 60.

Figure 10A:
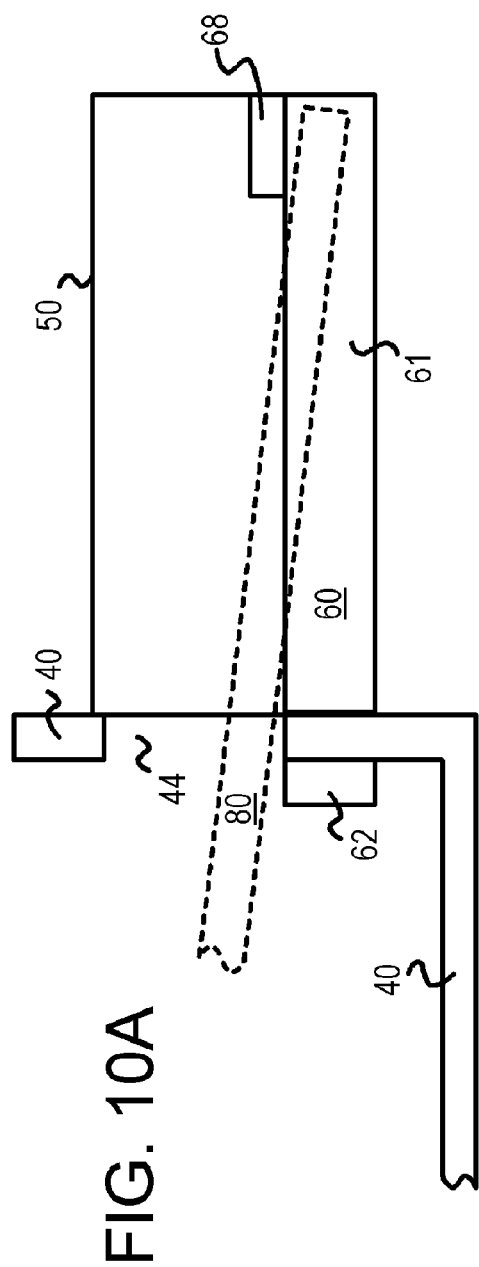
FIGS. 10A-B highlight the circuit board assembly fitting under the top tabs of the plug supporter.
Figure 10B:
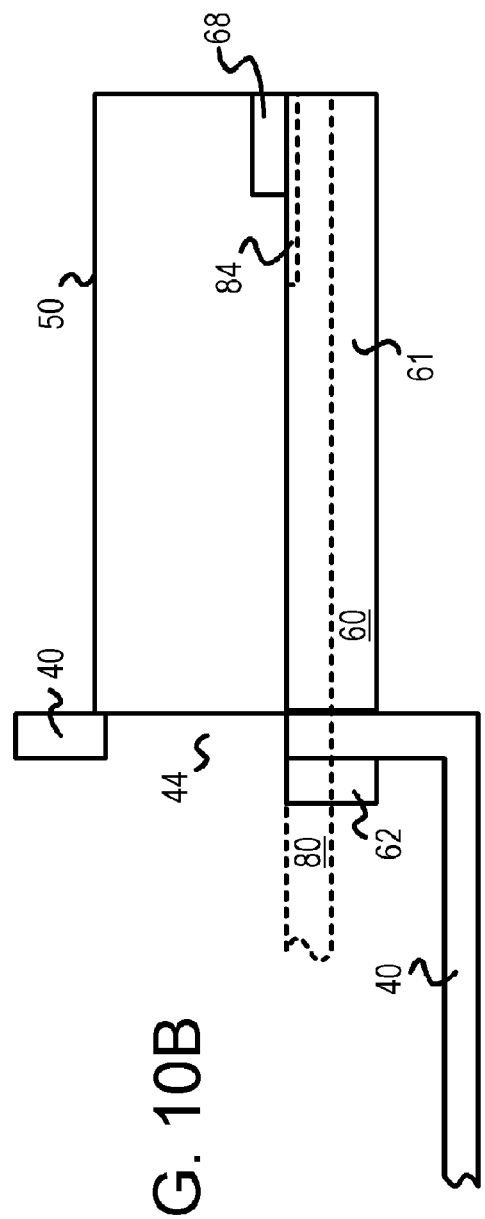

Top tabs 68 are formed on the front edge of plug supporter 60. Board 80 fits underneath top tabs 68. FIGS. 10A-B highlight the circuit board assembly fitting under the top tabs of the plug supporter. In FIG. 10A, USB metal wrap 50 has been attached to housing 40 by overmolding. Only a portion of housing 40 is shown in this enlargement. Plug supporter 60 has been inserted into the front (right) side of USB metal wrap 50 and locking tabs 62 have locked onto the inner side of housing 40 around opening 44.

Board 80 is fitted through the large upper opening of housing 40, and has its extension end fitted through opening 44 and into USB metal wrap 50. The extreme end of board 80 is fitted under top tabs 68, which may be formed above sidewalls 61 of plug supporter 60.

In FIG. 10B, board 80 is pushed downward into housing 40 into its final assembled position. The right (extension) end of board 80 fits under top tabs 68, while the middle of board 80 may rest on the bottom edge of opening 44. Board 80 may also rest on additional tabs, groves, or mounts that are formed within housing 40 as part of the molded shape of housing 40.

Top tabs 68 prevent board 80 from moving upward within USB metal wrap 50. USB metal contacts 84 on the extension end of board 80 may be pressed downward somewhat during plug insertion, but upward movement is restricted by top tabs 68. Board 80 may rest on lower tabs groves, or mounts that are formed on plug supporter 60 as part of the molded shape of plug supporter 60, and these may prevent downward movement of board 80. Thus board 80 is securely fitted within plug supporter 60, preventing wobble that is associated with cheap USB devices.

Figure 11:
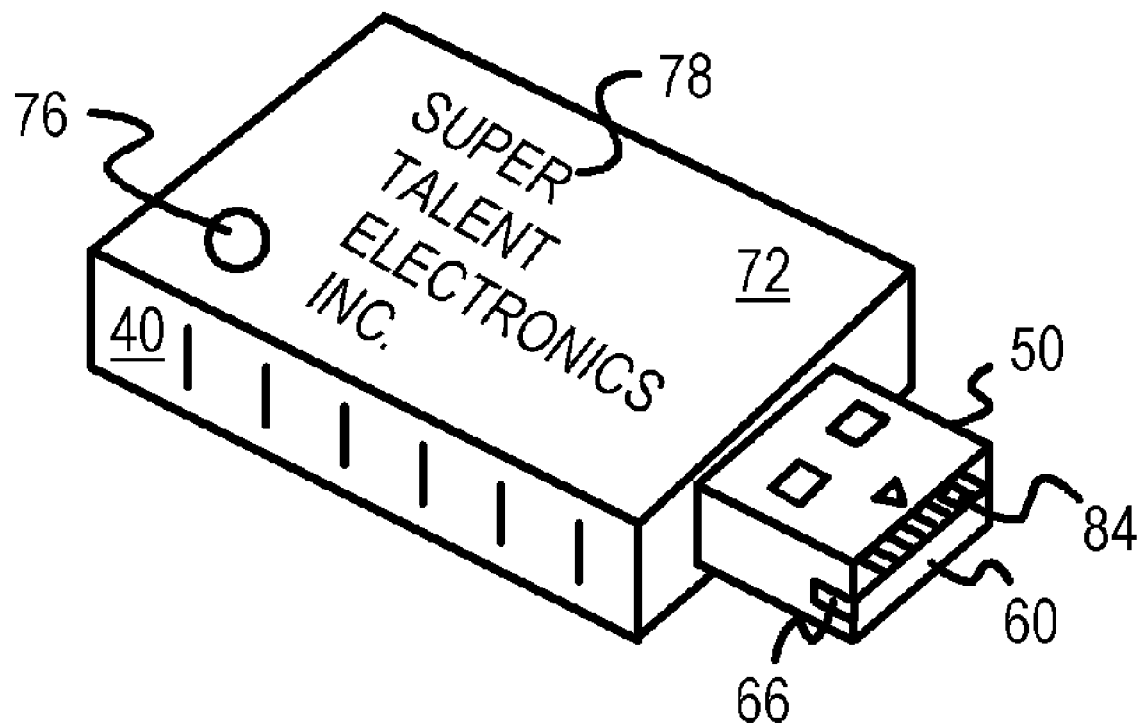
FIG. 11 shows a completed USB device using the parts shown in Figures.

FIG. 11 shows a completed USB device using the parts shown in FIGS. 8-10. Cover 72 has been attached to the upper opening of housing 40 after board 80 has been fitted within housing 40 and USB metal wrap 50. USB metal contacts 84 on board 80 are visible in the opening of USB metal wrap 50 and make contact with 4 metal contacts in a female USB socket when inserted. USB metal contacts 84 are prevented from wobbling by plug supporter 60, which has side tabs 66 that fit into side slots of USB metal wrap 50.

Cover 72 may be transparent, allowing light from a lite pipe or LED to pass through. Label 78 may be attached to cover 72, with opening 76 in label 78 that allows light from an indicator to pass through. Label 78 may be an adhesive label with a logo or trademark or other indicia printed on it.

Figure 12:
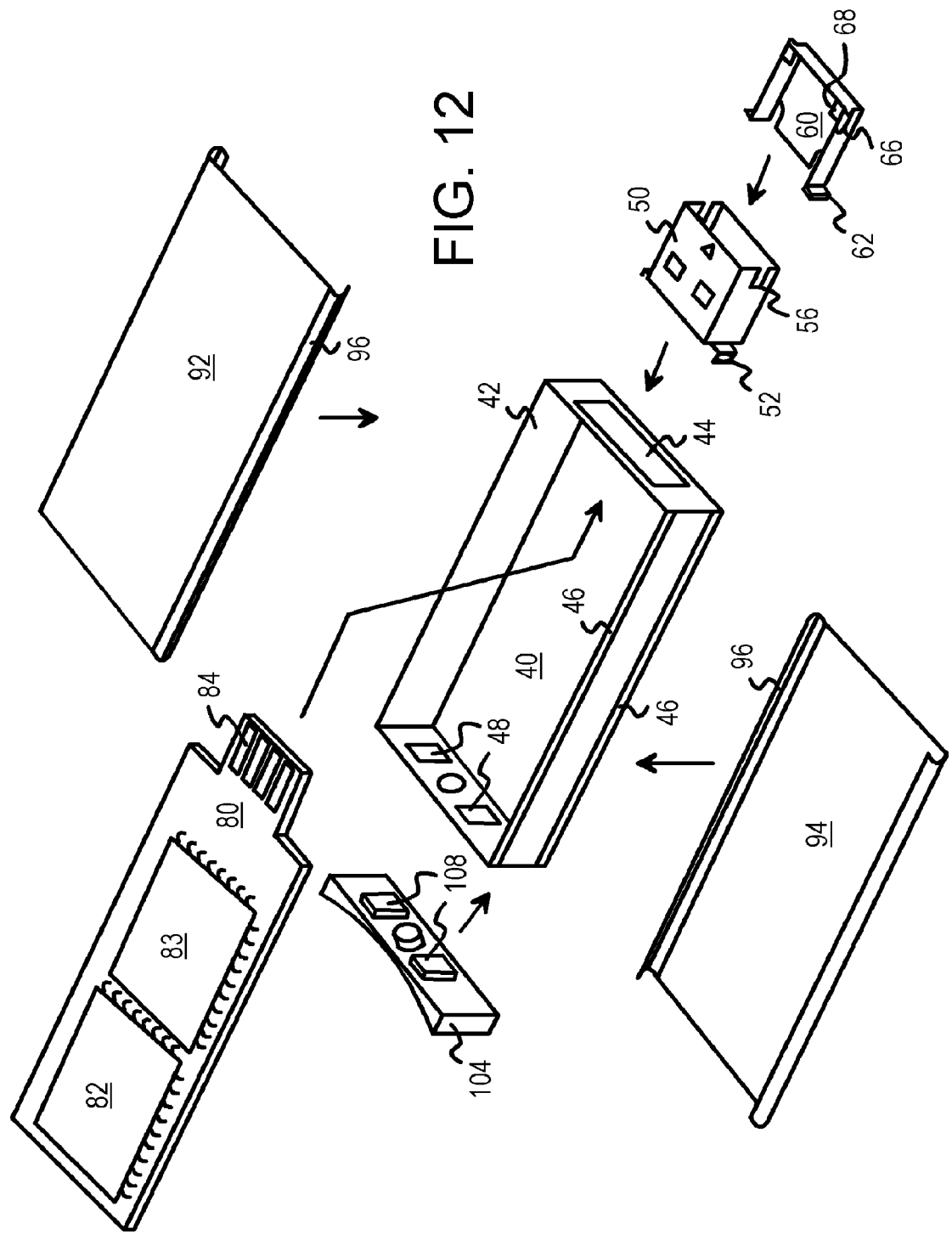
FIG. 12 shows an alternative USB device with the plug supporter and a light pipe.

FIG. 12 shows an alternative USB device with the plug supporter and a light pipe. Plug supporter 60 is fitted into USB metal wrap 50 and has locking tabs 62 that snap into opening 44 of housing 40. Side tabs 66 fit into side slots 56 of USB metal wrap 50 for additional support of plug supporter 60. USB metal wrap 50 is attached to opening 44 of housing 40, such as by an overmolding process.

Board 80 has an additional chip 83 mounted thereon, and is longer than board 80 shown in FIGS. 8-9. Housing 40 is extended in length, and has an additional large opening on the bottom. After board 80 is fitted into housing 40, bottom cover plate 94 is used to cover the bottom opening, with side rails 96 that slide over groves 94 in housing sidewalls 42 of housing 40. Likewise, top cover plate 92 cover the top opening of housing 40. Top cover plate also has side rails 96 that slide over groves 94 in housing sidewalls 42 of housing 40.

After board 80 has been fitted into housing 40, light pipe 104 is snapped onto the back of housing 40. Light pipe 104 has snaps 108 that fit into holes 48 on the back wall of housing 40. Light generated by a LED on board 80 can pass through the center hole in housing 40 and into light pipe 104 to allow the user to see the indicator light.

Figure 13B:
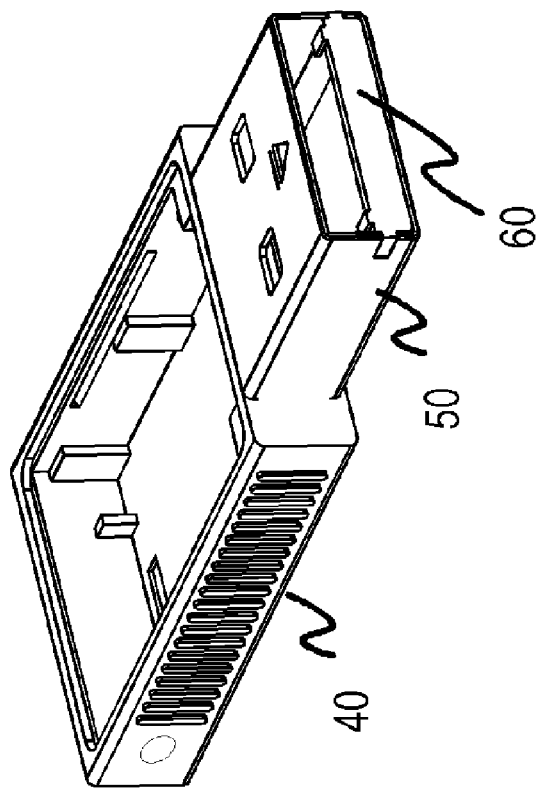
FIGS. 13A-B show intermediate steps in assembly of the USB device of FIGS. 8-9.
Figure 13A:
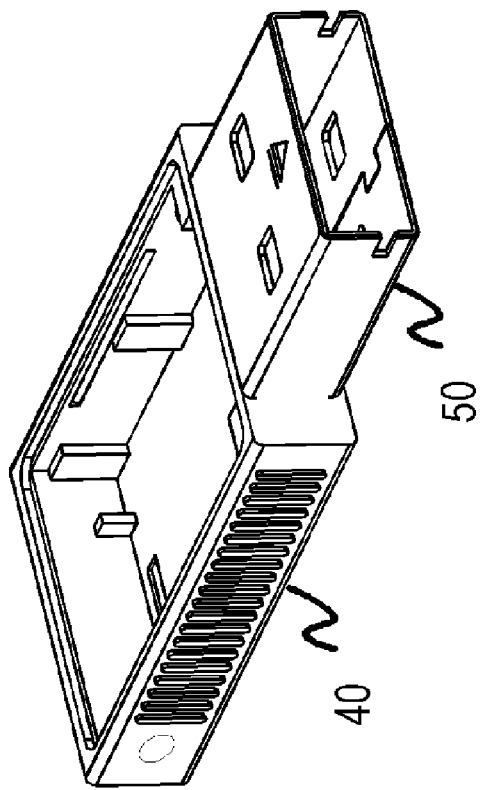

FIGS. 13A-B show intermediate steps in assembly of the USB device of FIGS. 8-9. In FIG. 13A, housing 40 has been attached to USB metal wrap 50 by an overmolding process. In FIG. 13B, plug supporter 60 has been inserted into USB metal wrap 50 and is visible in the front opening of USB metal wrap 50. Plug supporter 60 may be molded together with the housing 40 and metal wrap 50. The PCB assembly can next be inserted into the large upper opening of housing 40. Housing 40 has a central opening shaped to allow the circuit board to be inserted into housing 40 during assembly. Housing 40 may have a rear-end opening shaped to allow the circuit board to be inserted into housing 40 during assembly.

Figure 14:
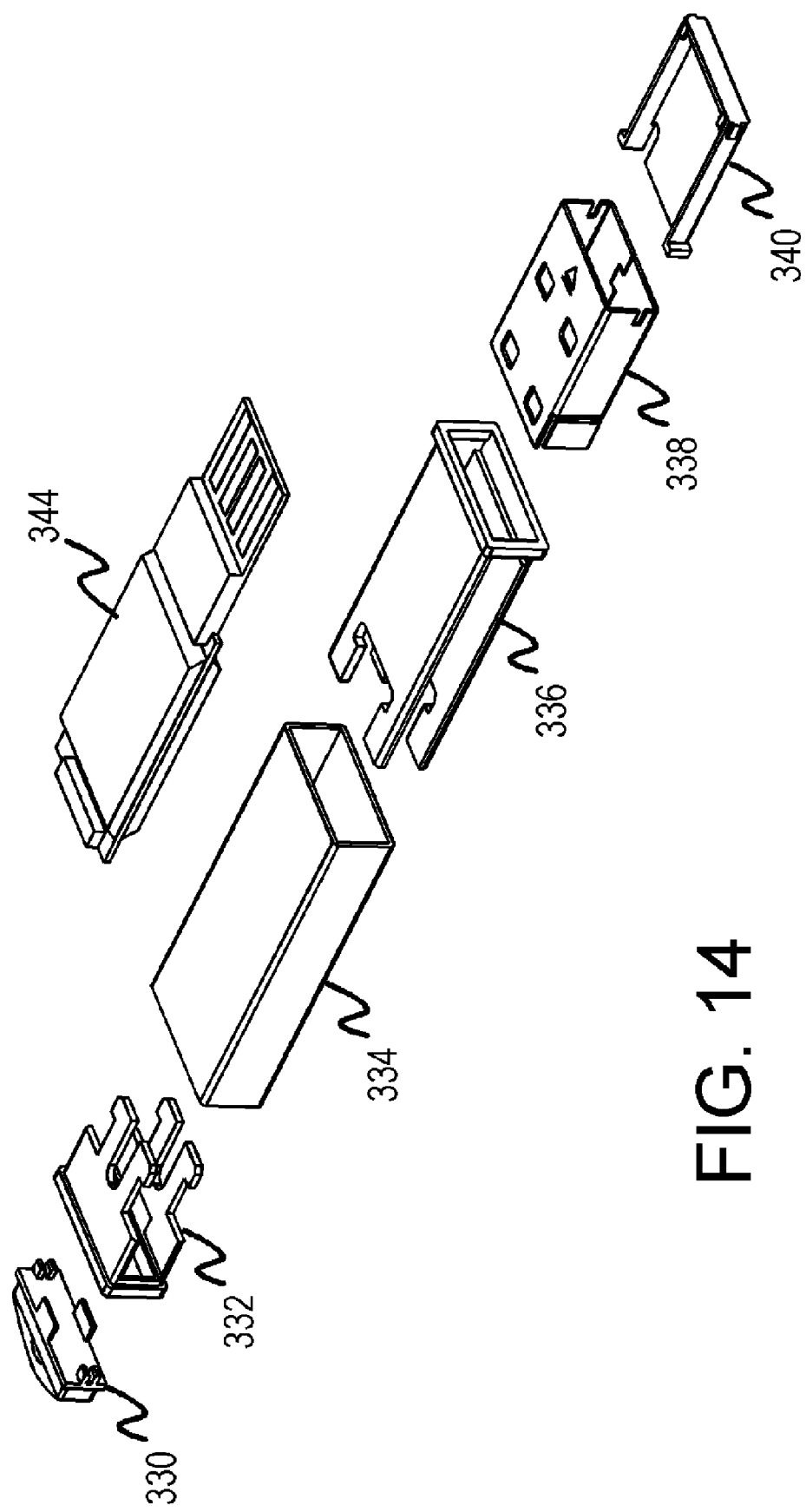
FIG. 14 shows an alternate embodiment using a metal-tube housing.

FIG. 14 shows an alternate embodiment using a metal-tube housing. Plug supporter 340 is similar to plug supporter 60 described in FIGS. 8-9 and fits into extended USB metal wrap 338. Extended USB metal wrap 338 is longer than USB metal wrap 50 (FIG. 8) and slides into the front opening of front housing 336. An overmolding process can mold front housing 336 to extended USB metal wrap 338.

Extended USB metal wrap 338 has a wider rear that the rear locking tabs of plug supporter 340 snap into, rather than having the locking tabs lock into front housing 336. Side tabs can be provided in plug supporter 340 to fit into side slots of extended USB metal wrap 338 to secure plug supporter 340 from wobbling.

During assembly, PCB assembly 344 is fitted into front housing 336 so that the USB metal contacts on PCB assembly 344 fit into extended USB metal wrap 338 and are supported by plug supporter 340. Top tabs on plug supporter 340 can retain the circuit board in place to prevent wobble.

Metal tube 334 can be slid over front housing 336, and then rear housing 332 can be fitted into the rear opening of metal tube 334. Snap-tabs on rear housing 332 can mate with locks on front housing 336 by locking fingers from both housings. PCB assembly 344 is secured between rear housing 332 and front housing 336, with metal tube 334 surrounding housings 332, 336. Light pipe 330 can be snapped onto the back of rear housing 332.

Figure 15:
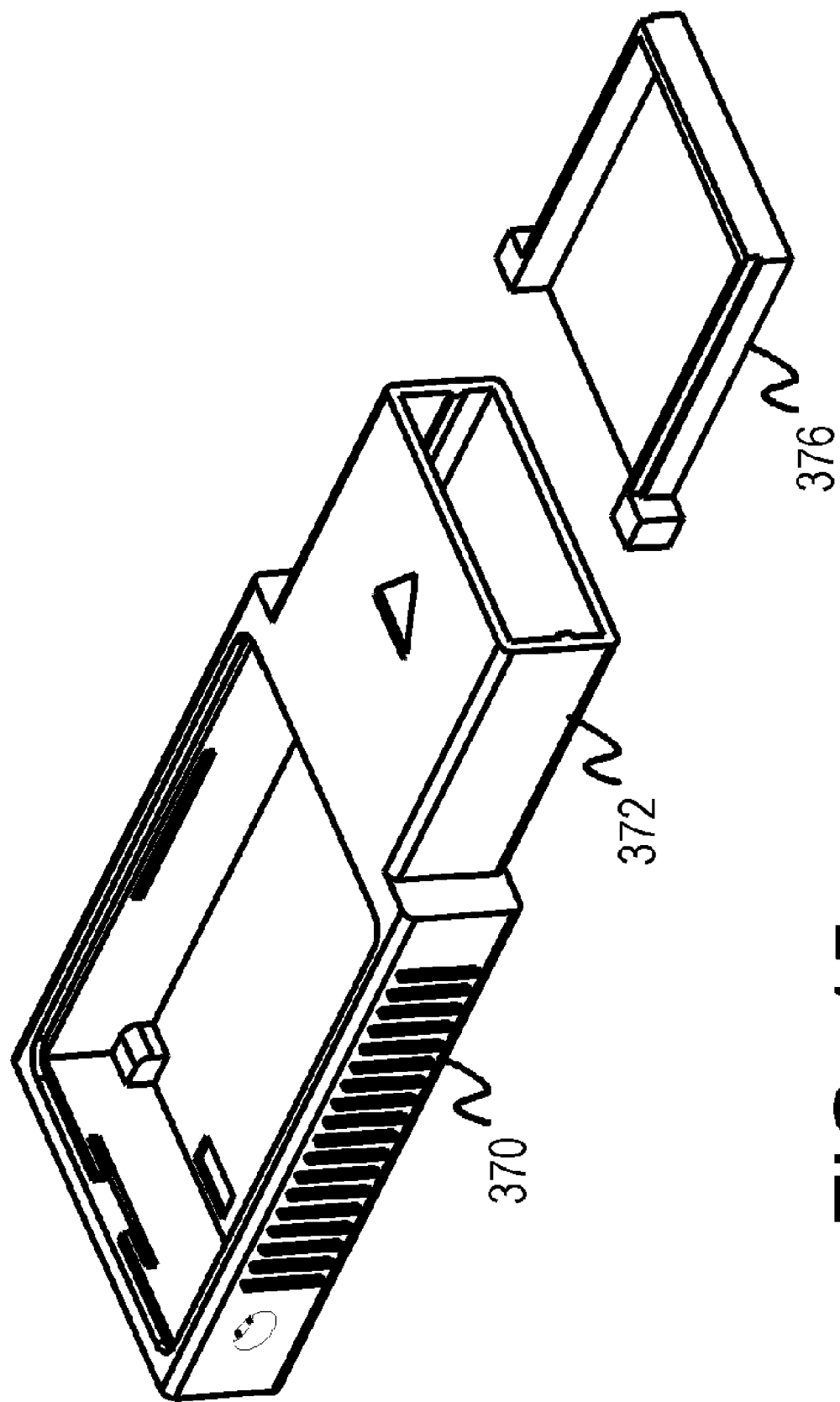
FIG. 15 shows an alternative USB device with a plastic USB wrap.

FIG. 15 shows an alternative USB device with a plastic USB wrap. Rather than combining USB metal wrap 50 with housing 40 by an overmolding process, a plastic USB wrap may be used and formed in a single molding step when the housing is formed. Housing 370 and USB plastic wrap 372 are formed together in a same molding step. While a metal USB wrap may be stronger, the plastic USB wrap may be sufficiently rigid for some applications. A hard plastic may be used to improve rigidity.

Plug supporter 376 may be similar to plug supporter 60 described earlier, or may have non-moveable locking tabs as shown. Plug supporter 376 may be inserted into the large upper opening in housing 370, rather than into the front opening of USB plastic wrap 372. Also, a ridge along the sidewalls of plug supporter 376 may slide along a grove on the inside of USB plastic wrap 372, rather than use side tabs and side slots.

Figure 16:
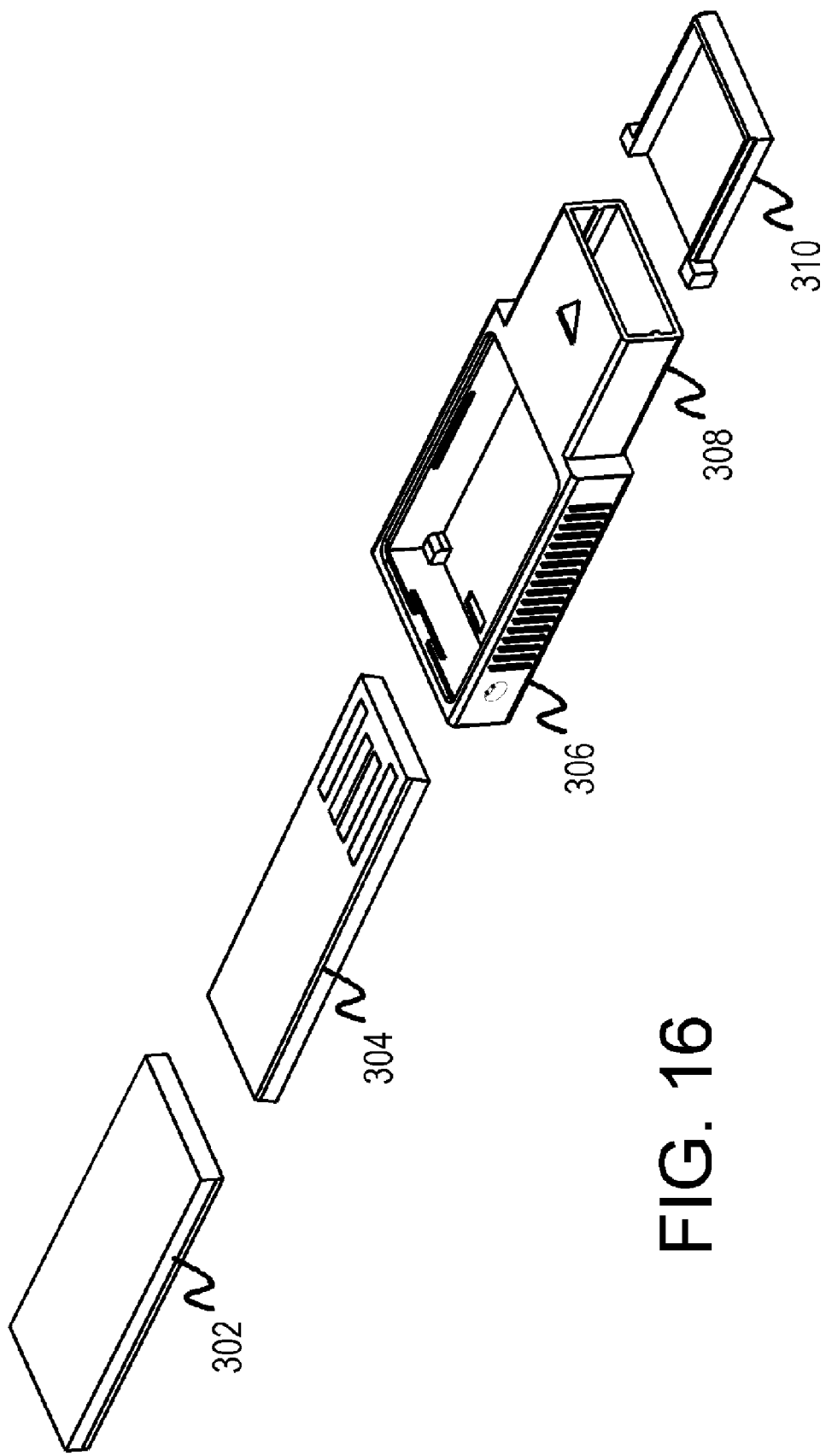
FIG. 16 shows an alternative USB device with a plastic USB wrap and a straight-sides PCBA.

FIG. 16 shows an alternative USB device with a plastic USB wrap and a straight-sides PCBA. Housing 306 and USB plastic wrap 308 are formed together in a same molding step.

Plug supporter 310 has non-moveable locking tabs. Plug supporter 310 is inserted into the large upper opening in housing 306, rather than into the front opening of USB plastic wrap 308. A ridge along the sidewalls of plug supporter 310 slides along a grove on the inside of USB plastic wrap 308.

Board 304 is a PCB assembly with a flash controller chip. Board 304 is inserted into the large upper opening of housing 306 so that USB metal contacts fit into USB plastic wrap 308 and are supported by plug supporter 310. Cover 302 covers the large upper opening of housing 306 of the assembled device. Board 304 may be a molded or an adhesive product. The adhesive process may be double-side, or may be a thermal adhesive.

ALTERNATE EMBODIMENTS other embodiments are contemplated by the inventors. For example, rather than use an overmolding process to attach USB metal wrap 50 to housing 40, other processes for attachment could be used. Plug supporter 60 could be integrated with housing 40, especially when a USB plastic wrap is used. While top tabs 68 have been described to prevent the circuit board from flexing upward, additional tabs, groves, ridges, or stops could be integrated with plug supporter 60 that are under the circuit board and prevent the circuit board from flexing downward.

A combination of the methods may be used, such as using adhesive for mounting the PCB but ultrasound or snaps for connecting plastic parts such as housing and covers together. Instead of using simple protrusion snap tabs and grooves, a combination of matching male and female fingers can be substituted. Snap-tabs with movable latching teeth or extensions or locking portions may also be used. Different thicknesses and dimensions can be substituted for the examples given. In some embodiments the top cover could be smaller than the bottom cover, or vice-versa.

USB metal contacts 84 could all have the same length, or the middle contacts could be shorter than the end PCB contacts. Caps for the USB connector plug can be added to embodiments, or can be deleted. Ribs or other features may be added to the housing and other parts to allow for better gripping by the user. Internal ribs could be added for increased strength or shock absorption.

Upper and lower covers may have an electrically-insulating backing layer, either directly applied to the covers, or added just before the covers are attached. The insulating layers can prevent unnecessary contact between the covers and traces or component on board 80. This is especially useful for metal covers, while plastic covers may not need such insulating layers.

Directional terms such as upper, lower, up, down, top, bottom, etc. are relative and changeable as the device is rotated, flipped over, etc. These terms are useful for describing the device but are not intended to be absolutes. Some embodiments may have chips or other components mounted on only one side of the circuit board, while other embodiments may have components mounted on both sides.

The LED can be mounted on board 80, such as on the bottom side with other components, or can extend from an edge of board 80. A region of reduced thickness may be formed in the housing to create a light window, rather than use a lightpipe. Light from the LED can partially pass through the thinner plastic of a light window, allowing the user to see a visible indicator of activity. A light guide or pipe could also be used to channel the light path to the light window.

Snap tabs can be semi-flexible plastic extensions or protrusion tabs formed on the outer edges of covers or housings and extend outward or inward. Rather than use snap tabs for assembly, raised ridges for ultrasonic bonding may be used, or an adhesive can be used, or some combination. Pressure or heat sensitive adhesive films can be attached to parts where bonding is desired. For example, an adhesive could be brushed on as a liquid or paste, or it could be a double-coated adhesive film such as 3M's 7953 film. A thermal bond film (TBF) such as 3M's TBF-668 could also be used. The adhesive can be cured by heating the assembly, by pressing the covers together, or by allowing sufficient time for curing.

Rather than mount packaged IC's onto one or more sides of board 80, unpackaged die may be mounted using die-bonding techniques. Using unpackaged die rather than packaged die may reduce the size and weight of the card. The edges of board 80 could be straight or could be rounded or have some other shape.

Supporting underside ribs or bumps may be added to the bottom of plug supporter 60 to better match the USB plug thickness. Various features can have a variety of shapes and sizes. Oval, round, square, rectangular, trapezoidal, and other shapes may be used.

The USB connector may be widened to accommodate extra metal contacts to become an extended-USB connector for future USB specification. Moreover, the width of the USB connector can be widened, and the height and metal contacts of the slim connector can be varied, making it into a general-purpose slim connector, for USB, extended-USB, PCI Express, mini PCI Express applications, etc.

Other applications besides flash drives include other portable USB devices that connect to desktop computers, notebook computers, PDA's, digital cameras, cellular phones or handsets, TV set-top boxes, MP3, MPEG4, copiers, printers, and other electronic devices. Such devices may use to advantage the reduced wobble of the new USB connectors, and may reduce size and space together with lower cost.

There are 4 pins in the current USB pin out definition—VCC, GND, D+, and D−. VCC is the 5V power pin. GND is the ground pin and D+ and D− are the differential data I/O pins. For the USB 2.0 specification, data transfer rates are up to 480M bits/sec, and the power supply current is 500 mA. These might not meet future (or even some current) needs of speed and power associated with some USB devices, such as large flash memory cards.

Rather than use USB buses, other serial buses may be used such as PCI Express, ExpressCard, Firewire (IEEE 1394), serial ATA, serial attached small-computer system interface (SCSI), etc. For example, when PCI Express is used, additional pins for the PCI Express interface can be added or substituted for the USB differential data pins. PCI express pins include a transmit differential pair PET+, PET−, and a receive differential pair PER+, PER− of data pins. A multi-bus-protocol chip could have an additional personality pin to select which serial-bus interface to use, or could have programmable registers. ExpressCard has both the USB and the PCI Express bus, so either or both buses could be present on an ExpressCard device.

The microcontroller and USB switch components such as the serial engine, DMA, flash-memory controller, transaction manager, and other controllers and functions can be implemented in a variety of ways. Functions can be programmed and executed by the CPU or other processor, or can be implemented in dedicated hardware, firmware, or in some combination. Many partitioning of the functions can be substituted.

The host can transfer standard USB packets to the serial engine during a transaction, such as a token, data, and handshake packet. Other packet types or variations of these types can be defined for special purposes. These packets may include a flash-controller-request packet, a flash-controller-reply packet, a boot-loader-request packet, a boot-loader-reply packet, a control-program-request packet, a control-program-reply packet, a flash-memory-request packet, and a flash-memory-reply packet. The flash-memory request/reply packets may further include the following request/reply packet pairs: flash ID, read, write, erase, copy-back, reset, page-write, cache-write and read-status.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A Universal-Serial-Bus (USB) device with an integrated USB connector comprising:
   a circuit board having a top surface and a bottom surface substantially parallel to the top surface, the circuit board having edges around a perimeter of the top and bottom surfaces, the circuit board having wiring traces;
   an integrated circuit mounted on the top surface or on the bottom surface of the circuit board;
   a housing shaped to surround the circuit board, the housing having a first opening shaped to allow the circuit board to be inserted into the housing during assembly;
   a USB wrap, attached to the housing, the USB wrap forming a perimeter of an integrated USB plug;
   an extension end of the circuit board, the extension end being shaped to fit inside the USB wrap when the circuit board is inserted into the housing during assembly;
   USB metal contacts formed on the top surface of the circuit board on the extension end of the circuit board, the USB metal contacts for making physical and electrical contact with metal contacts in a USB socket when the integrated USB plug is inserted into the USB socket; and
   a plug supporter sized to fit within the USB wrap, for supporting the extension end of the circuit board within the USB wrap,
   whereby the plug supporter supports the extension end of the circuit board within the USB wrap.

2. The USB device of claim 1 wherein the USB wrap further comprises:
   side slots extending from a front opening of the USB wrap;
   side tabs, formed on sides of the plug supporter, the side tabs for fitting into the side slots when the plug supporter is inserted into the USB wrap during assembly;
   wherein the side tabs engaging the side slots provides support of the plug supporter within the USB wrap.

3. The USB device of claim 2 further comprising:
   top tabs formed on the plug supporter, the top tabs for fitting over a top surface of the extension end of the circuit board;
   wherein the top tabs prevent upward movement of the extension end of the circuit board within the USB wrap once assembled.

4. The USB device of claim 3 further comprising:
   a front opening in the housing, the front opening sized to allow the extension end of the circuit board to pass through;
   wherein the USB wrap is attached to the housing over the front opening of the housing.

5. The USB device of claim 4 wherein the USB wrap is plastic and is formed during formation of the housing as a single integrated part with the housing.

6. The USB device of claim 4 wherein the integrated circuit mounted on the circuit board comprises:
   a USB flash microcontroller having a central processing unit (CPU) for executing instructions and a random-access memory (RAM) for storing instructions for execution by the CPU;
   a serial engine in the USB flash microcontroller for receiving USB packets from a host over a host USB bus;
   wherein the host USB bus includes the USB metal contacts on the extension end of the circuit board;
   a flash-memory controller in the USB flash microcontroller;
   flash mass storage blocks, coupled to the flash-memory controller, for storing non-volatile data for the host, the data in the flash mass storage blocks being block-addressable and not randomly-addressable; and a flash bus having parallel data lines for transferring data from the flash-memory controller to the flash mass storage blocks, the flash bus also carrying a command to the flash mass storage blocks over the parallel data lines and also carrying a flash address over the parallel data lines;

wherein a block of data in the flash mass storage blocks is addressable by the flash-memory controller sending the command and a physical address over the parallel data lines, the command and the physical address being used to transfer the block of data over the parallel data lines as a plurality of data words transferred in a plurality of bus cycles;

whereby the USB flash microcontroller is integrated with the flash mass storage blocks that are block-addressable.

7. The USB device of claim 4 further comprising:
locking tabs formed on a rear side of the plug supporter, the rear side opposite the front opening of the USB wrap once assembled;
wherein the locking tabs lock the plug supporter into place during assembly.

8. The USB device of claim 7 wherein the locking tabs are rigid and do not flex during assembly;
wherein the plug supporter is inserted into the USB wrap through the first opening of the housing.

9. The USB device of claim 7 wherein the locking tabs further comprise:
flexible extensions of the plug supporter that are distorted during insertion of the plug supporter into the USB wrap, the flexible extensions releasing to lock when the plug supporter is fully inserted into the USB wrap.

10. The USB device of claim 9 wherein the locking tabs engage an inner surface of the housing once assembled,
wherein the plug supporter is fitted through the front opening of the USB wrap during assembly until the locking tabs engage the inner surface of the housing.

11. The USB device of claim 4 wherein the USB wrap is metal;
wherein the USB wrap is attached to the housing by overmolding.

12. The USB device of claim 11 further comprising:
overmolding tabs on the USB wrap, the overmolding tabs for attaching the USB wrap to the housing during an overmolding process.

13. The USB device of claim 4 further comprising:
an upper cover, attachable to the housing during assembly, for covering the first opening of the housing to encapsulate the top surface of the circuit board when assembled.

14. The USB device of claim 13 wherein the upper cover is transparent; further comprising:
a light-emitting diode mounted to the circuit board, for generating an indicator light that passes through the upper cover to signal a user.

15. The USB device of claim 13 further comprising:
a lower cover, attachable to the housing during assembly, for covering a second opening of the housing to encapsulate the bottom surface of the circuit board when assembled.

16. The USB device of claim 4 further comprising:
a rear housing having snap tabs for attachment to locks on the housing during assembly, after the circuit board is inserted into the housing;
wherein the housing is a front housing having a front opening that the USB wrap is attached to.

17. The USB device of claim 16 further comprising:
a housing tube that the housing and the rear housing are slid into during assembly.

18. A portable Universal-Serial-Bus (USB) flash device comprising:
a printed-circuit board assembly (PCBA) having a circuit board with wiring traces, and an integrated circuit mounted to the circuit board;
a housing for holding the PCBA, the housing having a first opening that is sufficiently large to allow the PCBA to pass through;
a USB metal wrap attached to the housing;
an extension end of the circuit board, the extension end for fitting through the housing and for fitting within the USB metal wrap;
USB metal contacts formed on the extension end of the circuit board, the USB metal contacts forming a serial-data bus to a host;
a plug supporter that fits inside the USB metal wrap, for supporting the extension end of the circuit board within the USB metal wrap;
rear locking tabs on the plug supporter that lock the plug supporter in position within the USB metal wrap;
side tabs formed on sides of the plug supporter;
side slots formed on sides of the USB metal wrap, for receiving the side tabs of the plug supporter to fix the plug supporter in place within the USB metal wrap; and
top tabs formed on the plug supporter, for engaging the extension end of the circuit board, whereby the plug supporter supports the extension end of the circuit board within the USB metal wrap.

19. The portable USB flash device of claim 18 wherein the integrated circuit comprises:
a serial interface to the serial-data bus that connects to the host;
a serial engine for detecting and processing packets sent over the serial-data bus;
a serial-engine buffer for storing data sent over the serial-data bus;
an internal bus coupled to the serial-engine buffer;
a random-access memory (RAM) for storing instructions for execution, the RAM on the internal bus;
a central processing unit, on the internal bus, the CPU accessing and executing instructions in the RAM;
a flash-memory controller, on the internal bus, for generating flash-control signals and for buffering commands, addresses, and data to a flash bus;
flash mass storage blocks coupled to the flash-memory controller by the flash bus, and controlled by the flash-control signals; and
a direct-memory access (DMA) engine, on the internal bus, for transferring data over the internal bus.

20. A Universal-Serial-Bus (USB) device comprising:
a printed-circuit board assembly (PCBA) having a circuit board with wiring traces formed thereon, and an integrated circuit mounted to the circuit board;
housing means for housing the circuit board, the housing means having first opening means for allowing the circuit board to be inserted into the housing means during assembly;
USB wrap means, attached to the housing means, the USB wrap means forming a perimeter of an integrated USB plug;
an extension end of the circuit board, the extension end being shaped to fit inside the USB wrap means when the circuit board is inserted into the housing means during assembly;
USB metal contact means, formed on a top surface of the circuit board on the extension end of the circuit board, for making physical and electrical contact with metal contacts in a USB socket when the integrated USB plug is inserted into the USB socket;

plug supporter means, sized to fit within the USB wrap means, for supporting the extension end of the circuit board within the USB wrap means;

side slots extending from a front opening of the USB wrap means;

side tab means, formed on sides of the plug supporter means, for engaging the side slots when the plug supporter means is inserted into the USB wrap means during assembly;

wherein the side tab means provide support to the plug supporter means within the USB wrap means, whereby the plug supporter means supports the extension end of the circuit board within the USB wrap means.

21. The USB device of claim 20 further comprising:

top tab means, formed on the plug supporter means, for engaging the extension end of the circuit board, and for preventing wobble of the extension end of the circuit board within the USB wrap means once assembled.

* * * * *